(12) United States Patent
Nastasi et al.

(10) Patent No.: US 10,720,561 B2
(45) Date of Patent: Jul. 21, 2020

(54) THERMOELECTRIC ENERGY HARVESTING DEVICE AND METHOD OF HARVESTING ENVIRONMENTAL ENERGY

(71) Applicant: STMicroelectronics S.R.L., Agrate Brianza (IT)

(72) Inventors: Giuseppe Antonio Maria Nastasi, Tremestieri Etneo (IT); Roberta Giuffrida, Catania (IT); Agatino Minotti, Mascalucia (IT); Giuseppe Catania, Messina (IT); Salvatore Leonardi, Aci S. Antonio (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 607 days.

(21) Appl. No.: 14/985,096

(22) Filed: Dec. 30, 2015

(65) Prior Publication Data

US 2017/0200880 A1    Jul. 13, 2017

(30) Foreign Application Priority Data

Apr. 24, 2015  (IT) .............................. TO2015A0228

(51) Int. Cl.
*H01L 35/32* (2006.01)
*H01L 35/08* (2006.01)
(Continued)

(52) U.S. Cl.
CPC ............ *H01L 35/325* (2013.01); *H01L 35/32* (2013.01); *H01L 35/02* (2013.01); *H01L 35/04* (2013.01);
(Continued)

(58) Field of Classification Search
CPC ....... H01L 35/325; H01L 35/32; H01L 35/34; H01L 35/12; H01L 35/28; H01L 35/10;
(Continued)

(56) References Cited

U.S. PATENT DOCUMENTS 6,043,982 A   3/2000  Meissner
6,094,919 A   8/2000  Bhatia
(Continued)

FOREIGN PATENT DOCUMENTS

EP      1 976 034 A2   10/2008
JP      2010-027986 A   2/2010
(Continued)

OTHER PUBLICATIONS

Jin Xie "Design, Fabrication, and Characterization of CMOS MEMS-Based Thermoelectric Power Generators" Journal of Microelectromechanical Systems, vol. 19, No. 2, Apr. 2010, 317-324.*

(Continued)

*Primary Examiner* — Michael Y Sun
(74) *Attorney, Agent, or Firm* — Seed Intellectual Property Law Group LLP (57) ABSTRACT

A thermoelectric energy harvesting device including a first thermal-coupling interface, a second thermal-coupling interface, and a membrane. The membrane arranged between the first thermal-coupling interface and the second thermal-coupling interface and connected to the first thermal-coupling interface by a supporting frame. A thermal bridge between the second thermal-coupling interface and a thermal-coupling portion of the membrane. A thermoelectric converter on the membrane configured to supply an electrical quantity as a function of a temperature difference between the thermal-coupling portion of the membrane and the supporting frame.

14 Claims, 6 Drawing Sheets

(51) Int. Cl.
*H01L 35/04* (2006.01)
*H01L 35/02* (2006.01)
*H01L 35/10* (2006.01)
*H01L 35/28* (2006.01)
*H01L 35/12* (2006.01)
*H01L 35/34* (2006.01)

(52) U.S. Cl.
CPC .............. *H01L 35/08* (2013.01); *H01L 35/10* (2013.01); *H01L 35/12* (2013.01); *H01L 35/28* (2013.01); *H01L 35/34* (2013.01)

(58) Field of Classification Search
CPC ......... H01L 35/02; H01L 35/04; H01L 35/08; G01J 5/12
See application file for complete search history.

(56) References Cited

U.S. PATENT DOCUMENTS

| | | |
|---|---|---|
| 7,078,801 B2 | 7/2006 | Onoue |
| 7,301,233 B2 | 11/2007 | Lee et al. |
| 7,875,791 B2 | 1/2011 | Leonov et al. |
| 2002/0062649 A1* | 5/2002 | Ohkubo .................. H01L 35/00 62/3.7 |
| 2007/0034799 A1* | 2/2007 | Watanabe ............... G01J 5/061 250/338.1 |
| 2008/0271772 A1* | 11/2008 | Leonov .................... G01J 5/12 136/205 |
| 2011/0032679 A1 | 2/2011 | Baek et al. |

FOREIGN PATENT DOCUMENTS

| | | |
|---|---|---|
| JP | 2010101730 A * | 5/2010 |
| JP | 5152614 B2 | 2/2013 |
| KR | 2000-0056801 A | 9/2000 |
| WO | 00/41239 A1 | 7/2000 |

OTHER PUBLICATIONS

GTEG® Energy Harvester, "Customizable Thermoelectric Generator," greenTEG AG, Zurich, Switzerland, 2014, 1 page.
Jacquot et al., "Fabrication and modeling of an in-plane thermoelectric micro-generator," 21$^{st}$ International Conference on Thermoelectronics, IEEE 2002, pp. 561-564.
Kockmann et al., "Microstructured In-Plane Thermoelectric Generators with Optimized Heat Path," Transducers & Eurosensors '07, The 14$^{th}$ International Conference on Solid State Sensors, Actuators and Microsystems, Lyon, France, Jun. 10-14, 2007, 4 pages.
Xie et al., "Design, Fabrication, and Characterization of CMOS MEMS-Based Thermoelectric Power Generators," Journal of Microelectromechanical Systems, 19(2), Apr. 2010, pp. 317-324.

* cited by examiner

THERMOELECTRIC ENERGY HARVESTING DEVICE AND METHOD OF HARVESTING ENVIRONMENTAL ENERGY

BACKGROUND

Technical Field

The present disclosure relates to a thermoelectric energy harvesting device and to a method of harvesting environmental energy.

Description of the Related Art

As is known, systems for harvesting energy from environmental-energy sources have aroused and continue to arouse considerable interest in a large number of technological fields. Typically, energy harvesting systems (also known as "energy-scavenging systems") are designed to harvest, store, and transfer energy generated by mechanical, thermal, or chemical sources to a generic load of an electrical type. In this way, the electrical load does not need batteries or other power-supply systems, which are frequently cumbersome and not very resistant to mechanical stresses and entail maintenance costs for interventions of replacement.

Environmental energy may be harvested from different available sources and converted into electrical energy by appropriate transducers. For instance, available energy sources may be mechanical or acoustic vibrations or, more in general, forces or pressures, sources of chemical energy, electromagnetic fields, environmental light, and thermal-energy sources. For harvesting and conversion it is possible to use, for example, electrochemical, electromechanical, piezoelectric, electroacoustic, electromagnetic, photoelectric, electrostatic, thermoelectric, thermoacoustic, thermomagnetic, or thermionic transducers.

Systems based upon thermal-energy sources may use thermopile thermoelectric devices, which exploit a temperature difference between a hot body and a cold body to produce an electrical quantity. Known thermopile thermoelectric converters, albeit presenting a satisfactory efficiency, generally have a rather complex and cumbersome three-dimensional structure. For instance, the thermopile may be formed of an array of semiconductor pillars with different types of doping that extend between two plates, perpendicular thereto. Each pillar with a first type of doping has its ends electrically coupled to corresponding ends of two adjacent pillars, which both have a second type of doping. On the one hand, the complex structure renders the known thermoelectric devices costly to produce and not very sturdy from the mechanical standpoint. On the other, miniaturization, which is becoming an increasingly determining aspect, is hindered.

BRIEF SUMMARY

An aim of the present disclosure is to provide a thermoelectric energy harvesting device and a method of harvesting environmental energy that will enable the limitations described to be overcome or at least attenuated.

BRIEF DESCRIPTION OF THE SEVERAL VIEWS OF THE DRAWINGS

For a better understanding of the disclosure, some embodiments thereof will now be described purely by way of non-limiting example and with reference to the attached drawings, wherein.

DETAILED DESCRIPTION

Figure 1:
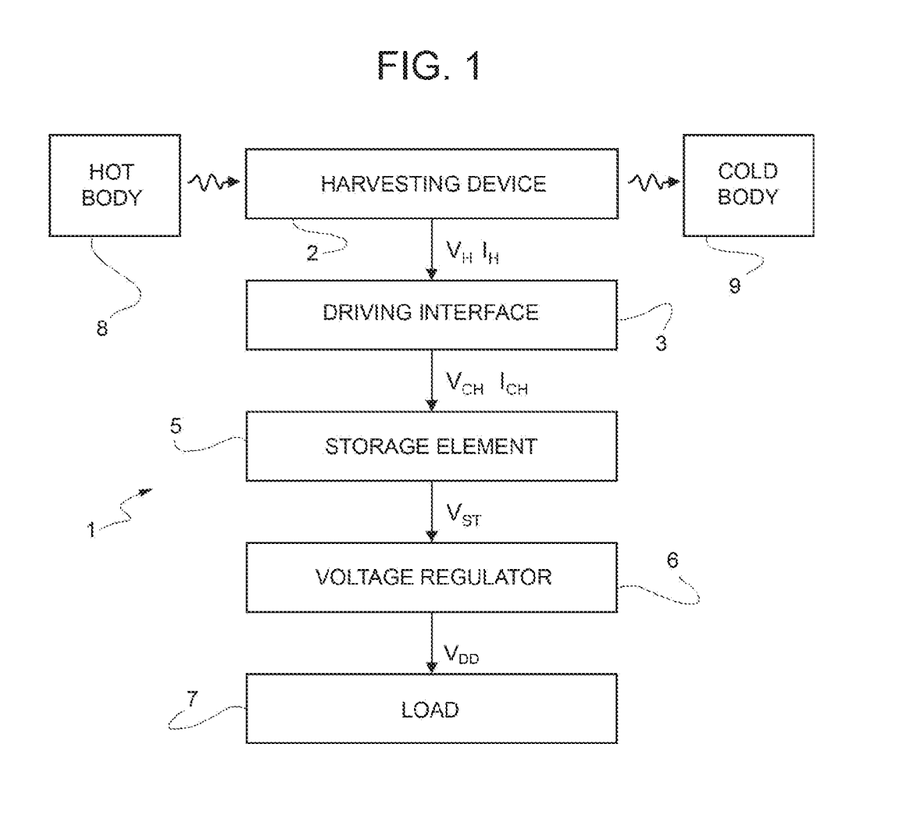
FIG. 1 is a simplified block diagram of a system for harvesting environmental energy.

With reference to FIG. 1, a system for harvesting environmental energy, designated as a whole by the reference number 1, comprises a thermoelectric energy harvesting device 2, a driving interface 3, a storage element 5, and a voltage regulator 6. In addition, an output of the voltage regulator 6 supplies an electrical load 7.

The thermoelectric energy harvesting device 2 is thermally coupled between a hot body 8 (or heat source) at a higher temperature and a cold body 9 (or heat sink) at a lower temperature and uses the temperature difference between the hot body 8 and the cold body 9 for supplying harvesting electrical quantities, in particular a harvesting voltage $V_H$ and a harvesting current $I_H$.

The driving interface 3 receives the harvesting voltage $V_H$ and the harvesting current $I_H$ from the thermoelectric energy harvesting device 2 and supplies charging electrical quantities, in particular a charging voltage $V_{CH}$ and a charging current $I_{CH}$, to the storage element 5. The energy stored in the storage element 5 increases as a result of the energy transferred thanks to the charging voltage $V_{CH}$ and to the charging current $I_{CH}$ and determines a storage voltage $V_{ST}$ that follows charging profile of the storage element 5 itself.

The voltage regulator 6 receives the storage voltage $V_{ST}$ and supplies a regulated supply voltage $V_{DD}$ to the electrical load 7 as required.

Figure 2:
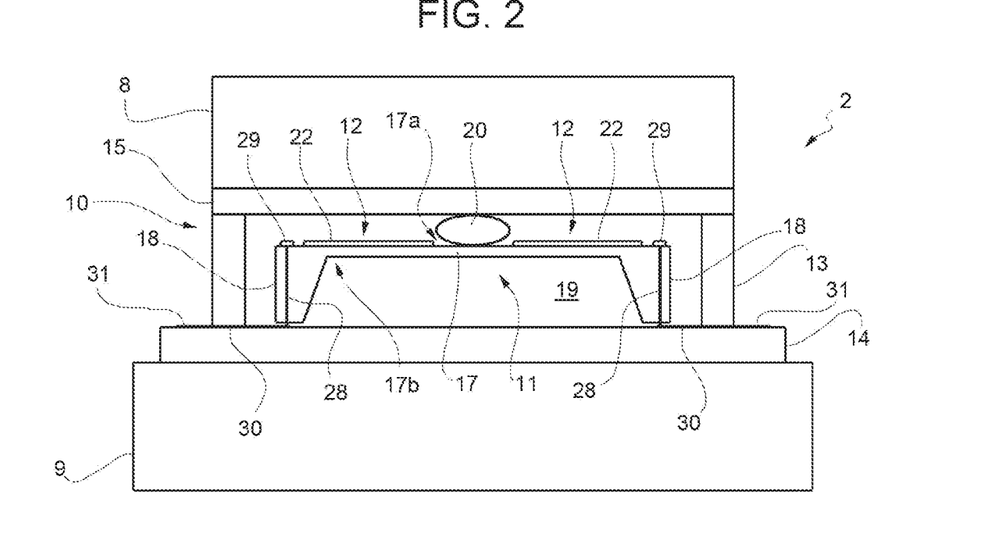
FIG. 2 is a cross-section through a thermoelectric energy harvesting device according to one embodiment of the present disclosure.
Figure 3:
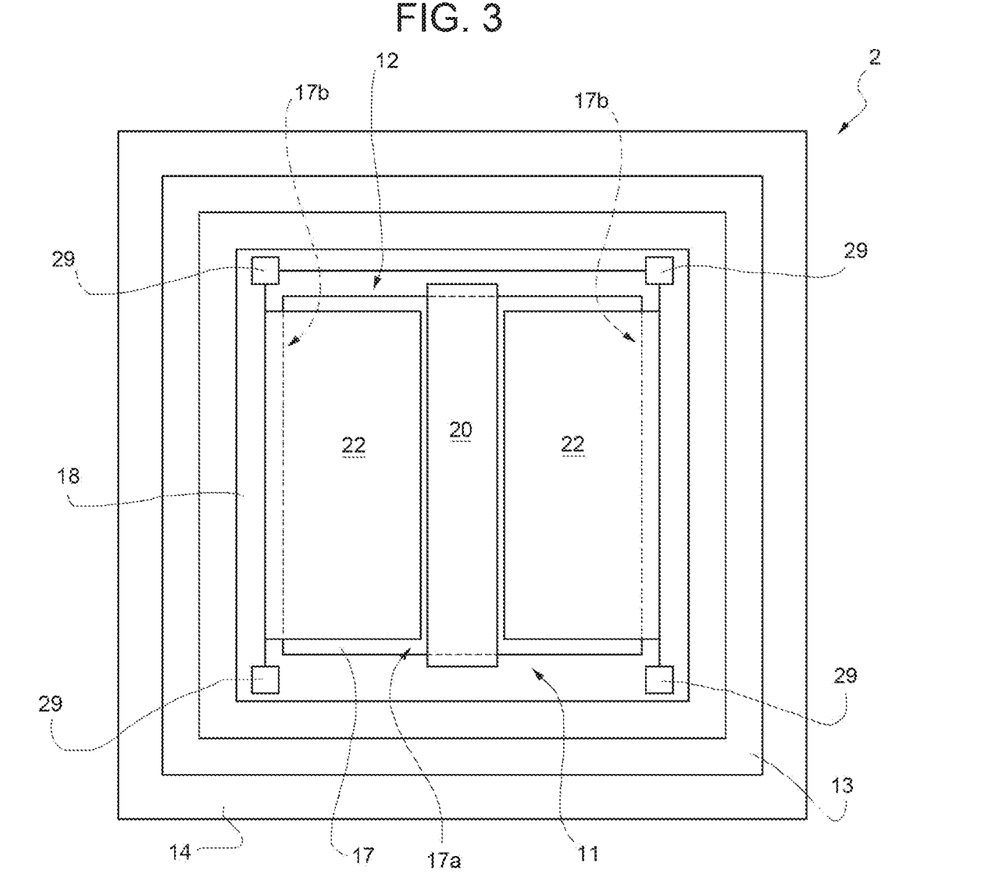
FIG. 3 is a top plan view, with parts removed for clarity, of the thermoelectric device of FIG. 2.

FIGS. 2 and 3 show in greater detail the thermoelectric energy harvesting device 2, which, in one embodiment, comprises a package structure 10, a heat-conveying structure 11 and a thermoelectric converter 12.

FIG. 2 further illustrates the hot body 8 and the cold body 9, which may, by way of non-limiting example, be a microprocessor or other integrated circuit, and a heat dissipater, respectively.

The package structure 10 comprises a framelike lateral structure 13, closed on opposite sides by a first thermal-coupling interface 14 and by a second thermal-coupling interface 15. In one embodiment, the first thermal-coupling interface 14 is a thermally conductive ceramic plate arranged on which are both the lateral structure 13 and the heat-conveying structure 11. The second thermal-coupling interface 15 is a metal lid arranged on the lateral structure 13. In this case, the first thermal-coupling interface 14 is in contact with the cold body 9, and the second thermal-coupling interface 15 is in contact with the hot body 8. This is not in any case to be considered limiting in so far as the device may operate also with a flow of heat in the opposite direction. The inside of the lateral structure 13 may be sealed from the first thermal-coupling interface 14 and from the second thermal-coupling interface 15.

The heat-conveying structure 11, in the presence of a temperature difference between the hot body 8 and the cold body 9, conveys heat between the first thermal-coupling interface 14 and the second thermal-coupling interface 15. In greater detail, the heat-conveying structure 11 includes a membrane 17, a supporting frame 18, connecting the membrane 17 to the first thermal-coupling interface 14, and a thermal bridge 20 between the second thermal-coupling interface 15 and a thermal-coupling portion 17a of the membrane 17. In one embodiment, the thermal-coupling portion 17a may be a central portion of the membrane 17.

In one embodiment, the membrane 17 and the supporting frame 18 are integrated in a same semiconductor die. The membrane has a peripheral portion 17b connected to the supporting frame 18, which is fixed to the first thermal-coupling interface 14. The supporting frame 18 keeps the membrane 17 suspended over a cavity 19 delimited by the membrane 17 itself on one side and by the first thermal-coupling interface 14 on the other. In some embodiments, the cavity 19 may be filled with a thermally insulating material, whether solid (for example, a polymeric material) or gaseous (for example, air). In one embodiment, a vacuum may be formed around the membrane 17. Thanks to the first thermal-coupling interface 14, the supporting frame 18 is at a temperature close to the temperature of the cold body 9. The supporting frame 18 thus couples the membrane 17 to the first thermal-coupling interface 14 both mechanically and thermally.

In one embodiment, the thermal bridge 20 is defined by a continuous element with high thermal conductivity, for example of metal, arranged in contact with the second thermal-coupling interface 15 and with the thermal-coupling portion 17a of the membrane 17. The thermal bridge 20 is arranged symmetrically with respect to the membrane 17. In the example illustrated in FIG. 3, the membrane 17 is quadrangular and the thermal bridge 20 extends along a median line parallel to the sides. The region of contact between the thermal bridge 20 and the membrane 17 defines the thermal-coupling portion 17a. The high thermal conductivity and the contact with the second thermal-coupling interface 15 causes the thermal bridge 20 to be substantially at the temperature of the hot body 8.

Consequently, in the configuration represented in FIG. 2 heat flows from the hot body 8 to the cold body 9 through the second thermal-coupling interface 15, the thermal bridge 20, the membrane 17, the supporting frame 18, and the first thermal-coupling interface 14. As has been said, however, the flow of heat may follow the reverse path, if the hot body 8 and the cold body 9 are coupled to the first thermal-coupling interface 14 and to the second thermal-coupling interface 15, respectively.

Figure 4:
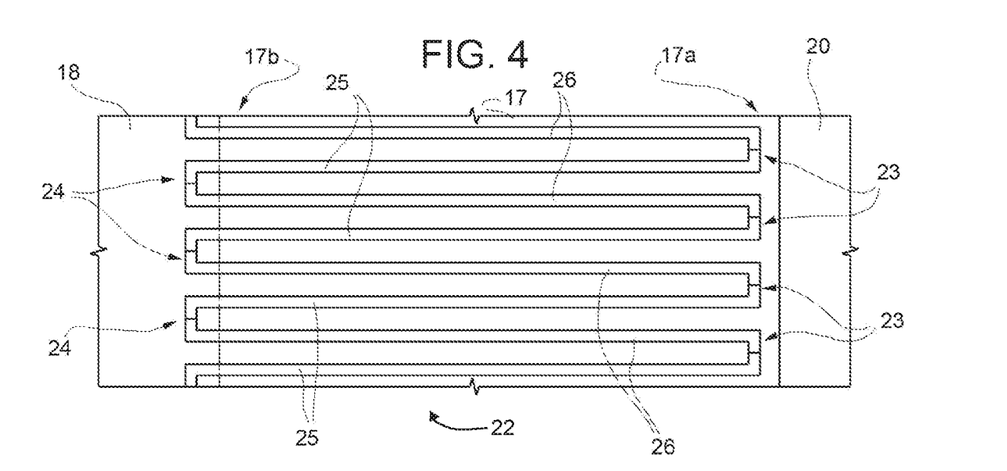
FIG. 4 shows an enlarged detail of the view of FIG. 3.

The thermoelectric converter 12 comprises a plurality of thermopiles 22 arranged symmetrically with respect to the thermal bridge 20 and electrically coupled, for example in series. In the embodiment of FIGS. 2 and 3, in particular, two thermopiles 22 are present. With reference also to FIG. 4, the thermopiles 22 have respective first junctions 23, thermally coupled to the thermal-coupling portion 17a of the membrane 17, and respective second junctions 24 away from the thermal-coupling portion 17a of the membrane 17 along the path of the flow of heat between the hot body 8 and the cold body 9. For instance, the second junctions 24 may be located on the supporting frame 18. In the embodiment illustrated, the first junctions 23 and the second junctions 24 define hot junctions and cold junctions of the thermopiles 22, respectively. In one embodiment not illustrated, the second junctions 22 may be located on a peripheral portion of the membrane.

In greater detail, each thermopile 22 comprises a plurality of respective first semiconductor strips 25, which have a first type of doping, and a plurality of respective second semiconductor strips 26, which have a second type of doping, opposite to the first type of doping. The first semiconductor strips 25 and the second semiconductor strips 26 extend parallel to one another on a face of the membrane 17 between the thermal-coupling portion 17a and the supporting frame 18. The first semiconductor strips 25 and the second semiconductor strips 26 are consecutive to one another, alternate with one another, and have respective first ends in the proximity of the first or thermal-coupling portion 17a of the membrane 17 and respective second ends in the proximity of the supporting frame 18. The first ends of adjacent first semiconductor strips 25 and second semiconductor strips 26 (close to the thermal-coupling portion 17a) are connected to one another and form respective first junctions 23. The second ends of adjacent first semiconductor strips 25 and second semiconductor strips 26 close to the supporting frame 18 are connected to one another and form respective second junctions 24. In practice, the first semiconductor strips 25 and the second semiconductor strips 26 form a plurality of thermocouples arranged electrically in series and thermally in parallel between the region of thermal coupling 17a of the membrane 17 and the supporting frame 18.

Through vias 28 in the supporting frame 18 connect terminals 29 of the thermopiles 22 to respective connection lines 30 (FIG. 2) that run on the first thermal-coupling interface 14 and traverse the framelike lateral structure 13. In turn, the connection lines 30 are coupled to respective pads 31, which enable the electrical quantities generated by the thermoelectric converter 12 to be transferred onto the outside of the package structure 10. In one embodiment (not illustrated), the through vias 28 may be replaced by wire bondings, if the distance between the membrane 17 and the second thermal-coupling interface 15 so allows.

The device described enables efficient exploitation of thermopiles with a basically two-dimensional configuration. In particular, the heat-conveying structure 11 with the membrane 17 favors both provision of efficient, sturdy, and compact devices and containment of the manufacturing costs. In addition to offering a plane surface suited to housing the thermopiles 22, which are two-dimensional, the membrane 17 has a thermal resistance much greater than both the thermal bridge 20 and the supporting frame 18 on account of the small thickness and, as regards the thermal bridge 20, also on account of the lower thermal conductivity. The membrane 17 supports almost entirely or in any case to a preponderant extent the temperature difference between the hot body 8 and the cold body 9. The thermal jump between the hot junctions and the cold junctions is thus very high as compared to the maximum thermal jump available, and the thermopiles 22 work efficiently. Furthermore, the efficiency benefits from the fact that, in a direction perpendicular to the faces of the membrane 17, the dispersion due to conduction of heat is very contained. Outside the thermal-coupling portion 17a, in fact, the membrane 17 is set facing thermally insulating regions both on the side of the cavity 19 (which may contain air or another solid or gaseous insulating material), and on the opposite side. The heat-conveying structure 11 thus enables the flow of heat between the hot body 8 and the cold body 9 to be guided basically along the membrane 17, enabling effective exploitation of the available thermal jump.

As has been mentioned, the device described is also sufficiently sturdy. In particular, the strips that form the thermopiles 22 do not have to support mechanical loads and are adequately protected within the package structure 10 also in regard to stresses of a certain degree.

Figure 5:
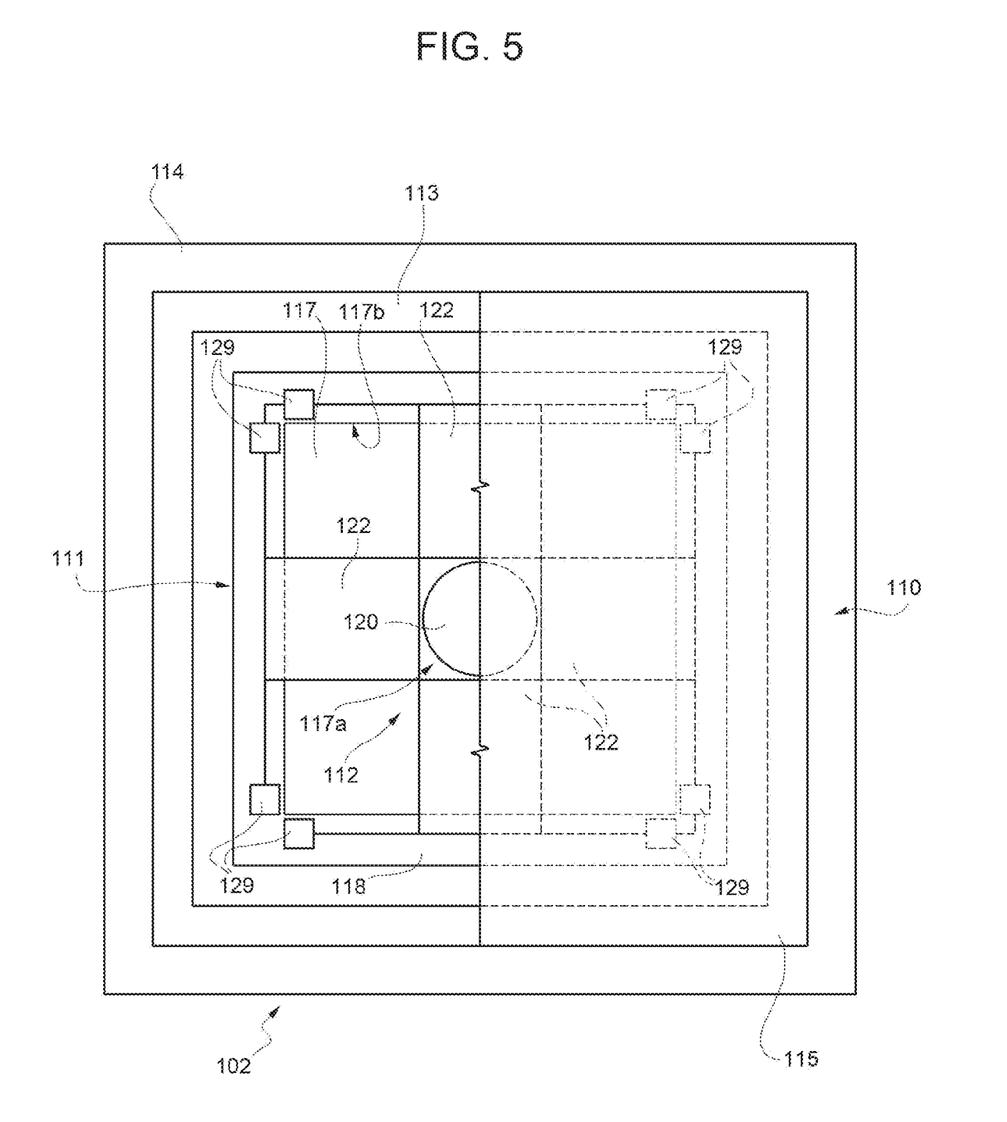
FIG. 5 is a top plan view, with parts removed for clarity, of a thermoelectric energy harvesting device according to a different embodiment of the present disclosure.

FIG. 5 illustrates a different embodiment of the present disclosure. In this case, a thermoelectric energy harvesting device 102 comprises a package structure 110, a heat-conveying structure 111, and a thermoelectric converter 112. The package structure 110 is substantially made as already described and comprises a lateral framelike structure 113, closed on opposite sides by a first thermal-coupling interface 114 and by a second thermal-coupling interface 115 (here illustrated only in part).

The heat-conveying structure 111 includes a membrane 117, a supporting frame 118, connecting a peripheral portion 117b of the membrane 117 to the first thermal-coupling interface 114, and a thermal bridge 120 between a central thermal-coupling portion 117a of the membrane 117 and the second thermal-coupling interface 115.

In this case, the thermal bridge 120 is defined by a metal drop or ball in contact both with the thermal-coupling portion 117a of the membrane 117 and with the second thermal-coupling interface 115.

The thermoelectric converter 112 comprises four thermopiles 122, arranged symmetrically with respect to the thermal bridge 120. The thermopiles 122 extend in directions perpendicular to one another from the coupling portion 117a towards a respective side of the membrane 117, which in this case has a quadrangular shape. The hot junctions and cold junctions (not illustrated) of the thermopiles 122 are arranged, respectively, in the proximity of the coupling portion 117a of the membrane 117 and in the proximity of the supporting frame 118. The thermopiles 112 may further be electrically coupled to one another, for example in series by connection lines between respective terminals 129.

Figure 6:
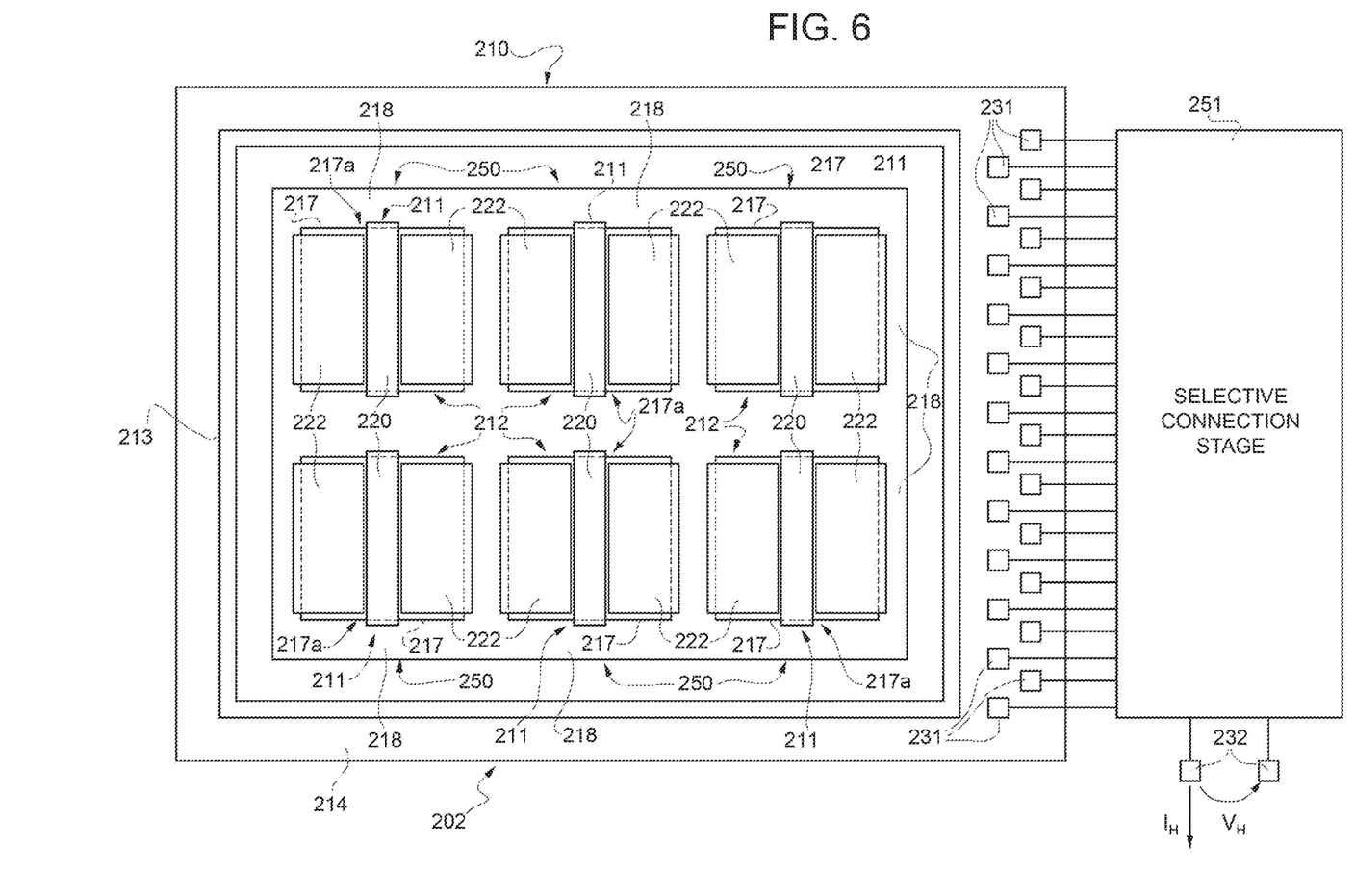
FIG. 6 is a top plan view, with parts removed for clarity, of a thermoelectric energy harvesting device according to a further embodiment of the present disclosure.

In the embodiment illustrated in FIG. 6, a thermoelectric energy harvesting device 202 has a modular structure. In greater detail, the thermoelectric energy harvesting device 202 comprises a package structure 210, a heat-conveying structure 211, and a plurality of thermoelectric converters 212.

The package structure 210 is substantially built as already described and comprises a framelike lateral structure 213, closed on opposite sides by a first thermal-coupling interface 214 and by a second thermal-coupling interface (here not illustrated; the connection to the lateral structure 213 and to the heat-conveying structure 211 is in any case obtained substantially in line with what has already been described and illustrated with reference to FIGS. 1-5).

The heat-conveying structure 211 comprises a plurality of membranes 217 connected to the first thermal-coupling interface 214 by respective supporting frames 218, which, in one embodiment, are connected to one another and form a single piece. More precisely, the membranes 217 and the frames 218 are provided in a single semiconductor die, and the membranes 217 are arranged in an orderly fashion to form an array for optimizing the area occupied. The heat-conveying structure 211 further comprises one thermal bridge 220 for each membrane 217. The thermal bridges 220 are in contact, on one side, with thermal-coupling portions of respective membranes 217a and, on the other, with the second thermal-coupling interface (which, as in the embodiments already described, may be a thermally conductive plate that closes the lateral structure 213 on a side opposite to the first thermal-coupling interface 214).

Arranged on each membrane 217 is a respective thermoelectric converter 212, which comprises a plurality of thermopiles 222, arranged symmetrically with respect to the corresponding thermal bridge 220. In the example described, each thermoelectric converter 212 comprises two thermopiles 222.

The thermoelectric energy harvesting device 202 is thus modular, and each module 250 includes a membrane 217, with the respective frame 218, and a thermoelectric converter 212.

In one embodiment, terminals of the thermopiles 222 are connected to respective pads 231, which are in turn coupled to respective terminals of a configurable selective-connection stage 251, for example a bank of switches or another electronic circuit with equivalent functions. The connection may be obtained, for example, by through vias in the frames 218 and connection lines (not illustrated) on the first thermal-coupling interface 214. The selective-connection stage 251 has output terminals 232 for supplying the harvesting voltage $V_H$ and the harvesting current $I_H$ and may be accessible from outside for setting an operating mode of the thermoelectric energy harvesting device 202. In particular, the selective-connection stage 251 may be configured to select one or more of the modules 250, possibly excluding others, and for connecting the selected modules 250 in series or in parallel. The configuration of the selective-connection stage 251 may be arranged, for example, manually, by positioning jumpers as required, or else via software, by electronic interfaces. In one embodiment, the configuration of the selective-connection stage may be modified without restrictions throughout the service life of the thermoelectric energy harvesting device 2 and, possibly, also during its operation.

The modular structure enables efficient exploitation of the surface available, increasing the number of the thermoelectric converters housed and, in practice, the power that may be supplied. At the same time, it is not necessary to extend the surface of the individual membranes, which might otherwise be weakened.

Figure 7A:
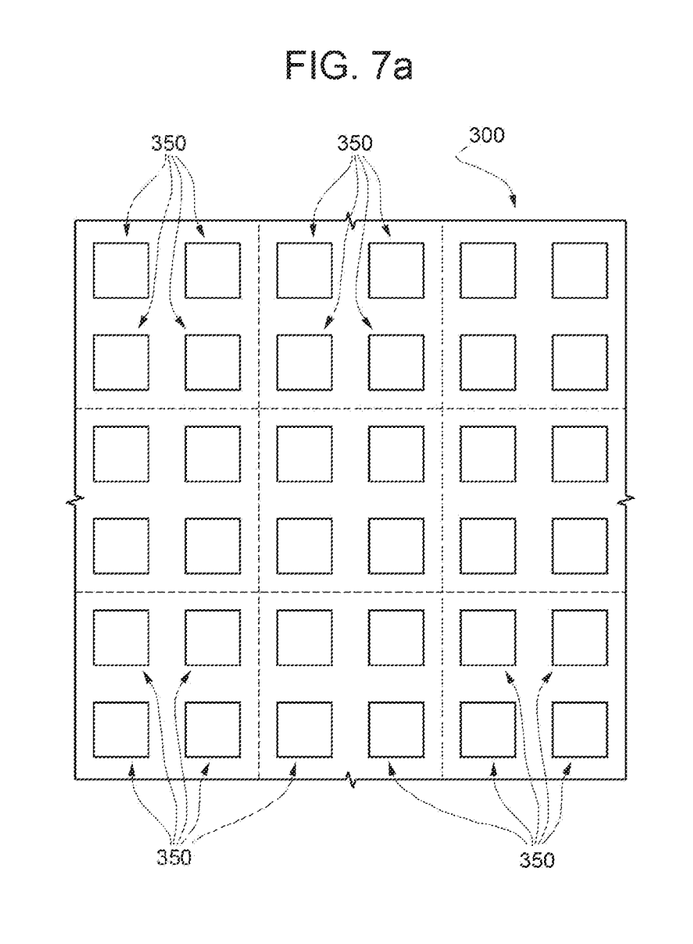
FIG. 7a is a top plan view of a semiconductor wafer in a step of a process for manufacturing a thermoelectric energy harvesting device according to an embodiment of the present disclosure.
Figure 7B:
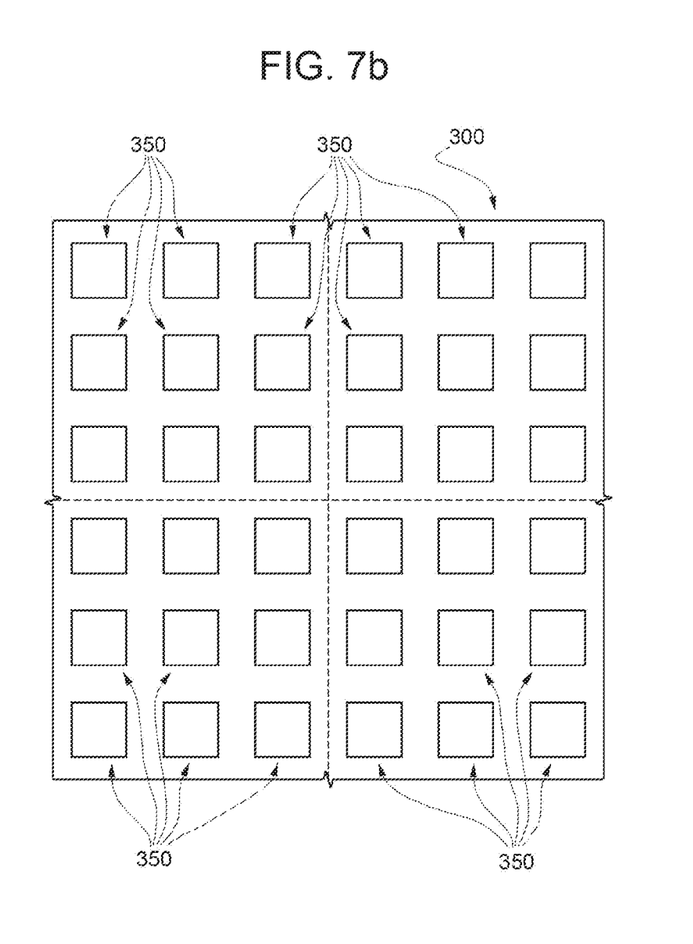
FIG. 7b is a top plan view of a semiconductor wafer in a step of a process for manufacturing a thermoelectric energy harvesting device according to another embodiment of the present disclosure.

In the embodiment illustrated in FIG. 6, the thermoelectric energy harvesting device 202 comprises six modules 250 that form a 2×3 array. The number and arrangement of the modules may, however, be determined in a flexible way. The membranes, the frames, and the thermoelectric converters may in fact be all easily integrated in a single semiconductor wafer, which is divided into dice containing the desired number of modules. FIGS. 7a and 7b illustrate dicing of a wafer 300 into dice containing respectively four (2×2) and nine (3×3) modules 350.

Figure 8:
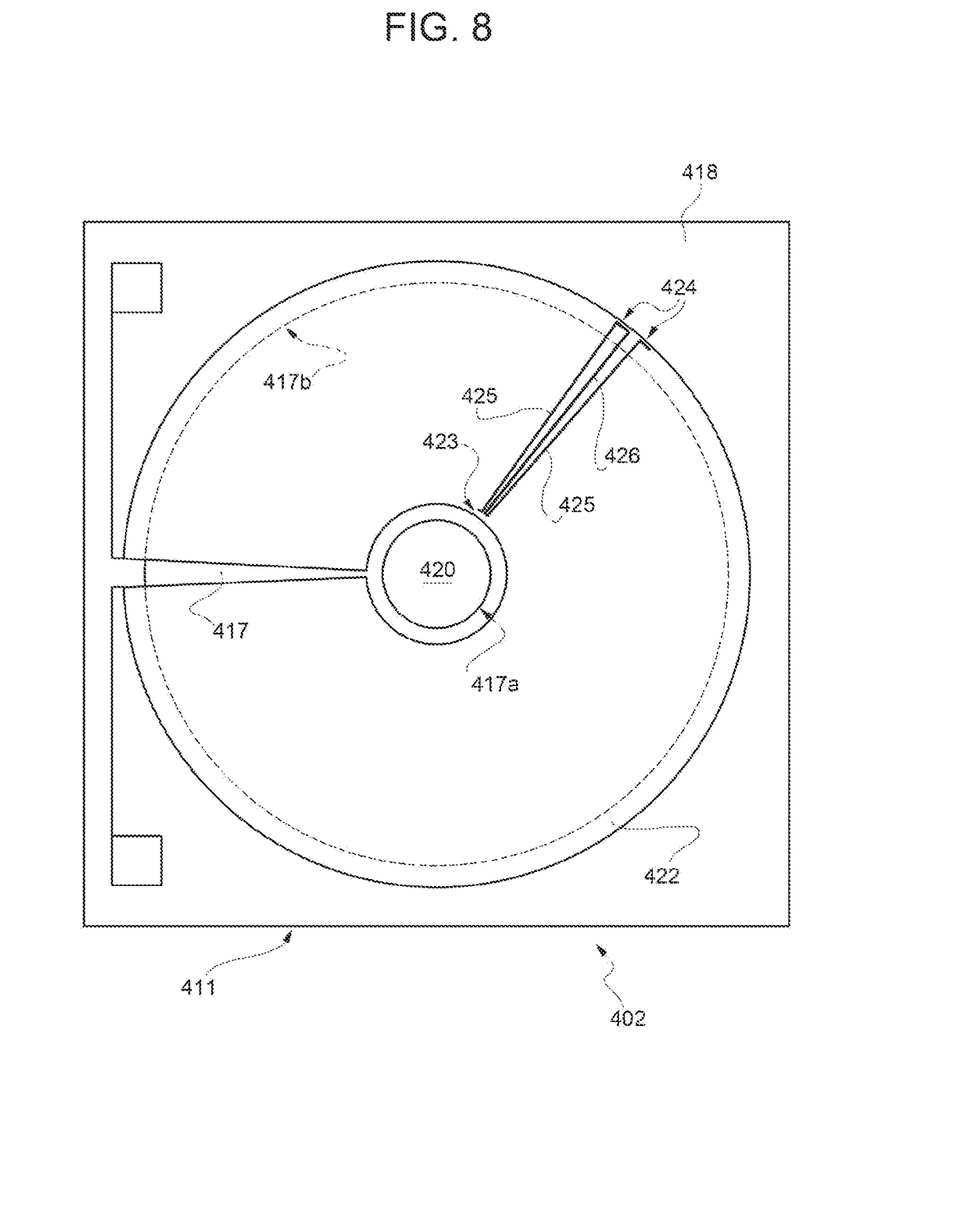
FIG. 8 is a top plan view, with parts removed for clarity, of a thermoelectric energy harvesting device according to a further embodiment of the present disclosure.

The membrane, arranged on which are the thermoelectric converters, does not necessarily have to present a quadrangular shape. According to the embodiment of FIG. 8, for example, in a thermoelectric energy harvesting device 402, a heat-conveying structure 411 may comprise a circular membrane 417, having a peripheral portion 417b connected to a supporting frame 418, which, for convenience, on the outside may be quadrangular. The thermal bridge 420 may include a drop or ball in contact with the membrane 417 at a central thermal-coupling portion 417a. In this case, the thermoelectric converter may also comprise a single thermopile 422 with conductive strips 425, 426 arranged radially and at a uniform distance apart over the entire membrane 417. Hot junctions 423 and cold junctions 424 of the thermopile 422 are arranged, respectively, in the proximity of the coupling portion 417a of the membrane 417 and in the proximity of the supporting frame 418.

Finally, it is evident that modifications and variations may be made to the thermoelectric device and to the method described herein, without thereby departing from the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thermoelectric energy harvesting device, comprising:
   a first thermal-coupling interface having a first surface that is opposite to a second surface;
   a second thermal-coupling interface having a first surface that is opposite to a second surface, the first surface of the first thermal-coupling interface facing the first surface of the second thermal-coupling interface;
   a supporting frame being between the first surface of the first thermal-coupling interface and the first surface of the second thermal-coupling interface and coupled to the first surface of the first thermal-coupling interface, the first surface of the first thermal-coupling interface being wider than the supporting frame in a first direction and a second direction that is transverse to the first direction;
   a membrane between the first thermal-coupling interface and the second thermal-coupling interface and coupled to the first thermal-coupling interface by the supporting frame;
   a thermal bridge between the second thermal-coupling interface and a thermal-coupling portion of the membrane;
   a thermoelectric converter on the membrane; and
   a lateral structure extending between and coupled to the first surface of the first thermal-coupling interface and the first surface of the second thermal-coupling interface, the first surface of the first thermal-coupling interface being spaced from the first surface of the second thermal-coupling interface by the supporting frame and the membrane, the lateral structure being wider than the supporting frame in the first direction and the second direction.

2. The device according to claim 1, wherein the supporting frame, the membrane, and the thermal bridge define a heat-conveying structure configured to convey heat between the first thermal-coupling interface and the second thermal-coupling interface.

3. The device according to claim 1, wherein the thermoelectric converter includes a thermopile on the membrane and facing the second thermal-coupling interface, the thermopile having first junctions and second junctions, the first junctions being closer to the thermal bridge than the second junctions.

4. The device according to claim 3, wherein the thermoelectric converter includes a plurality of thermopiles on the membrane and facing the second thermal-coupling interface, the thermopile, each having respective first junctions and respective second junctions, the first junctions being closer to the thermal bridge than the second junctions.

5. The device according to claim 4, wherein the thermopiles are arranged symmetrically with respect to the thermal bridge.

6. The device according to claim 5 wherein the thermal-coupling portion of the membrane includes a central region of the membrane; and wherein the first junctions are located in the proximity of the thermal-coupling portion of the membrane and the second junctions are located in the proximity of the supporting frame.

7. The device according to claim 6, wherein each thermopile comprises a plurality of respective thermocouples arranged electrically in series and thermally in parallel between the thermal-coupling portion of the membrane and the supporting frame.

8. The device according to claim 7, wherein:
   each thermopile comprises a plurality of respective first semiconductor strips which have a first type of doping, and a plurality of respective second semiconductor strips which have a second type of doping opposite to the first type of doping;
   the first semiconductor strips and the second semiconductor strips extend consecutively to and alternating with one another on a face of the membrane and have respective first ends in the proximity of the thermal-coupling portion of the membrane and respective second ends in the proximity of the supporting frame; and
   first ends of adjacent first semiconductor strips and second semiconductor strips form respective first junctions and second ends of adjacent first semiconductor strips and second semiconductor adjacent strips form respective second junctions.

9. The device according to claim 8, wherein the membrane has a quadrangular shape, and the first semiconductor strips and the second semiconductor strips are parallel to respective sides of the membrane.

10. The device according to claim 8, wherein the membrane has a circular shape, and the first semiconductor strips and the second semiconductor strips extend radially with respect to the membrane.

11. The device according to claim 1, wherein the thermal bridge comprises a thermally conductive body connecting the second thermal-coupling interface and the thermal-coupling portion of the membrane.

12. The device according to claim 1 further comprising a plurality of modules, each having a respective supporting frame, a respective membrane, and at least one respective thermoelectric converter on the respective membrane, the supporting frames of the modules being integrated with one another and formed in a single piece.

13. The device according to claim 12, wherein the thermoelectric converters of the modules have terminals coupled to a configurable selective-connection stage.

14. The device according to claim 1, wherein the membrane is set facing thermally insulating regions.

\* \* \* \* \*